United States Patent
Lo et al.

(10) Patent No.: US 12,107,136 B2
(45) Date of Patent: Oct. 1, 2024

(54) SCHOTTKY DIODE AND METHOD OF FABRICATION THEREOF

(71) Applicant: Taiwan Semiconductor Manufacturing Company, Ltd., Hsinchu (TW)

(72) Inventors: Wen-Shun Lo, Hsinchu County (TW); Yu-Chi Chang, Kaohsiung (TW); Yingkit Felix Tsui, Cupertino, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 197 days.

(21) Appl. No.: 17/804,125

(22) Filed: May 26, 2022

(65) Prior Publication Data

US 2023/0387241 A1    Nov. 30, 2023

(51) Int. Cl.
*H01L 29/47* (2006.01)
*H01L 29/06* (2006.01)
*H01L 29/66* (2006.01)
*H01L 29/872* (2006.01)

(52) U.S. Cl.
CPC .......... *H01L 29/47* (2013.01); *H01L 29/0619* (2013.01); *H01L 29/66143* (2013.01); *H01L 29/872* (2013.01)

(58) Field of Classification Search
CPC ............. H01L 29/47; H01L 29/0619; H01L 29/66143; H01L 29/872; H01L 21/823481; H01L 27/0629; H01L 29/0692; H01L 29/66575; H01L 29/0649
See application file for complete search history.

(56) References Cited

U.S. PATENT DOCUMENTS

| | | | |
|---|---|---|---|
| 8,334,579 B2 | 12/2012 | Yeh et al. | |
| 8,338,906 B2 | 12/2012 | Yeh et al. | |
| 8,604,582 B2 | 12/2013 | Lee | |
| 8,709,885 B2 | 4/2014 | Vellianitis et al. | |
| 8,860,168 B2 | 10/2014 | Chang et al. | |
| 9,887,302 B2 | 2/2018 | Lin et al. | |
| 10,050,157 B2 * | 8/2018 | Drobny | H01L 29/872 |
| 10,529,819 B2 * | 1/2020 | Mun | H01L 29/0619 |
| 10,566,465 B2 * | 2/2020 | Pang | H01L 21/76 |
| 10,818,789 B2 * | 10/2020 | Kumada | H01L 29/7813 |
| 11,177,342 B1 | 11/2021 | Tsai et al. | |
| 11,257,948 B2 * | 2/2022 | Haynie | H01L 21/74 |
| 2006/0131619 A1 * | 6/2006 | Wu | H01L 29/7806 257/260 |

(Continued)

*Primary Examiner* — Shahed Ahmed
*Assistant Examiner* — Khatib A Rahman
(74) *Attorney, Agent, or Firm* — Haynes and Boone, LLP

(57) ABSTRACT

A semiconductor device includes a substrate having a P-well region, an N-well region disposed on either side of and abutting the P-well region, and a deep N-well region disposed beneath and abutting both the P-well region and at least part of the N-well region on either side of the P-well region. The semiconductor device further includes a first conductive layer formed over a cathode region of the P-well region, where a Schottky barrier is formed at a junction of the first conductive layer and the P-well region. The semiconductor device further includes a second conductive layer formed over anode regions of the P-well region, where the anode regions are disposed on either side of the cathode region.

20 Claims, 13 Drawing Sheets

(56) References Cited

U.S. PATENT DOCUMENTS

| | | | |
|---|---|---|---|
| 2009/0283841 A1* | 11/2009 | Yeh | H01L 27/0814 |
| | | | 257/E27.06 |
| 2019/0103498 A1* | 4/2019 | Pang | H01L 29/36 |
| 2021/0217857 A1* | 7/2021 | Chao | H01L 29/8725 |

* cited by examiner

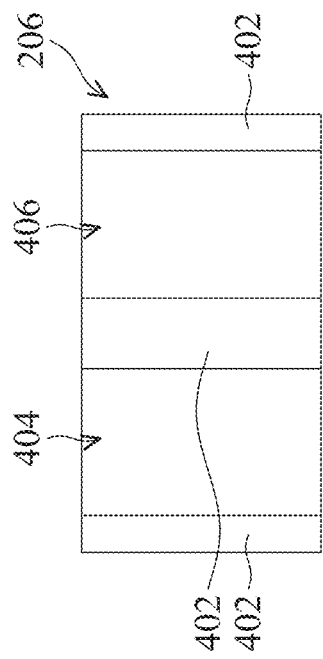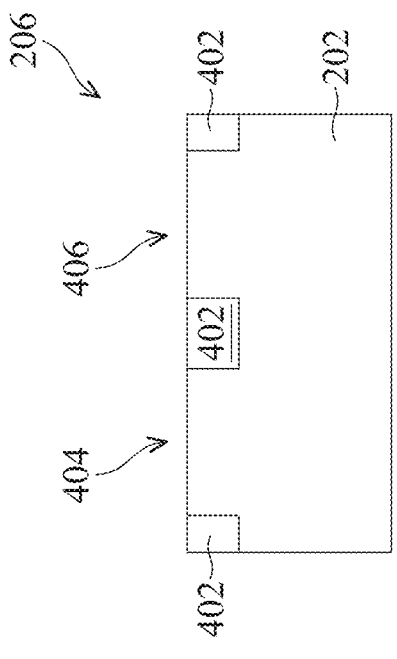
FIG. 3A  FIG. 4A
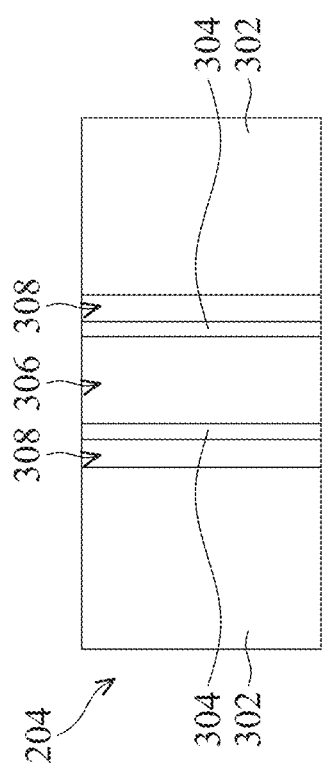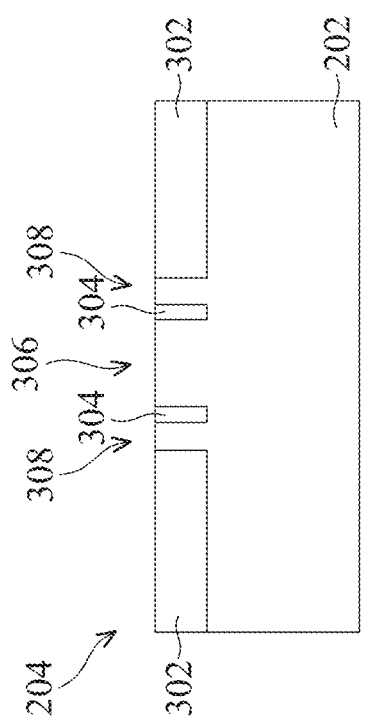
FIG. 3B  FIG. 4B

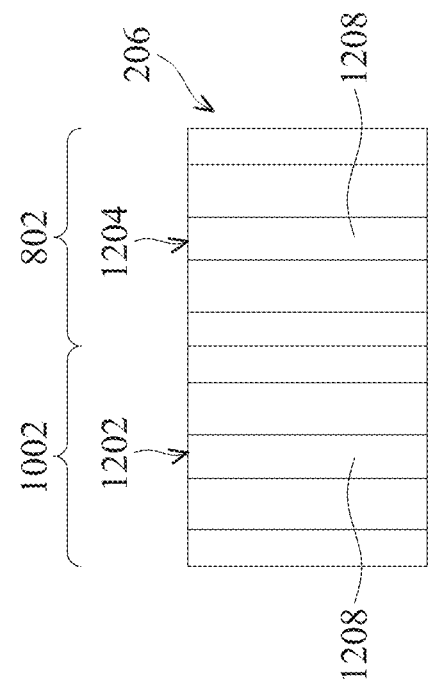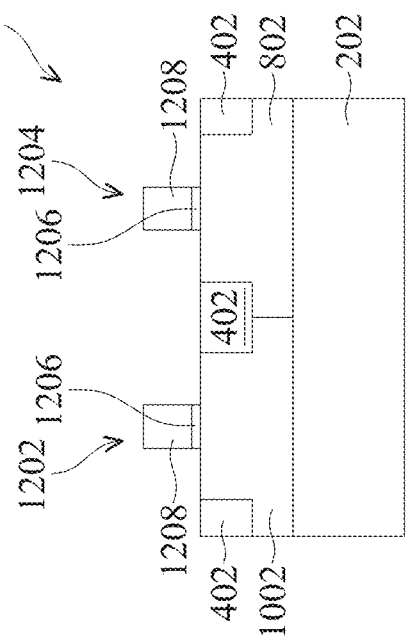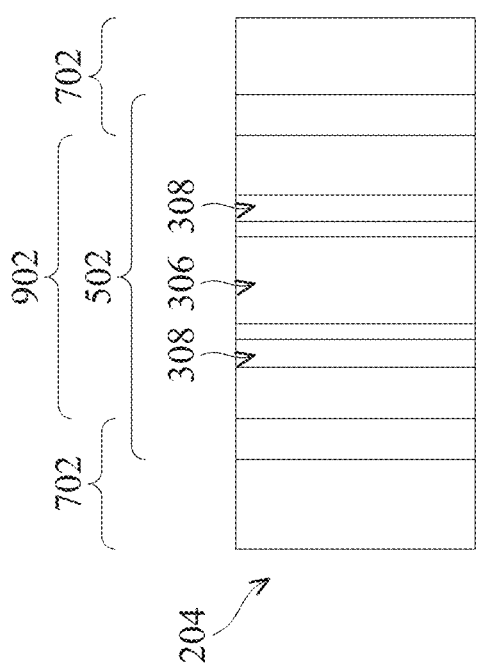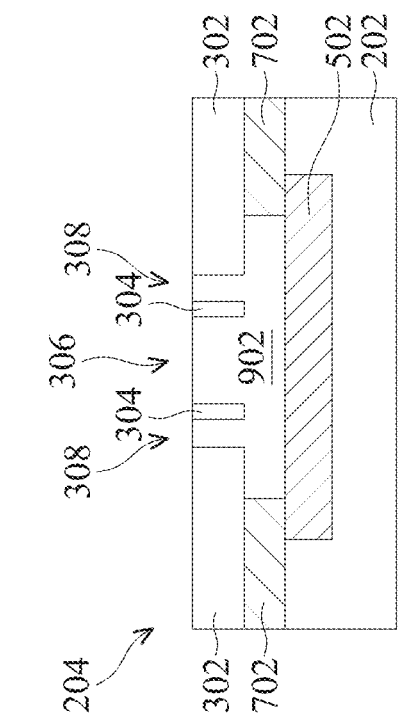

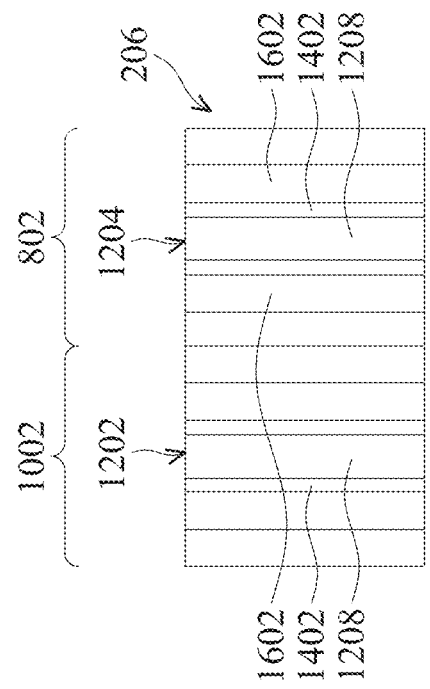
FIG. 15A
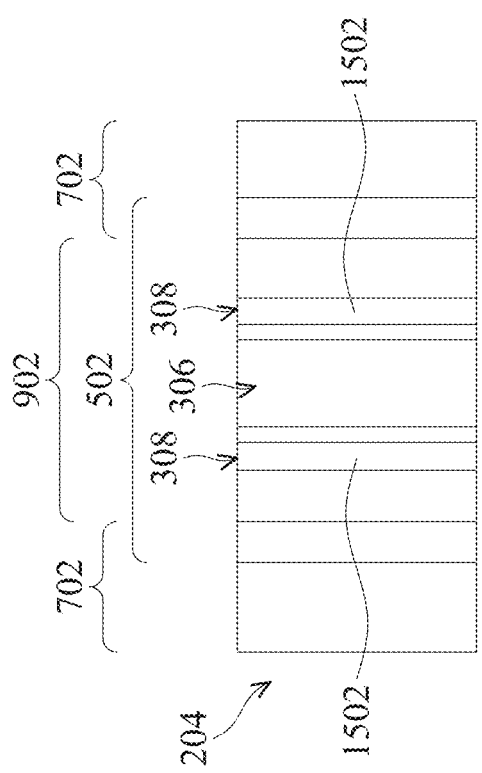
FIG. 16A
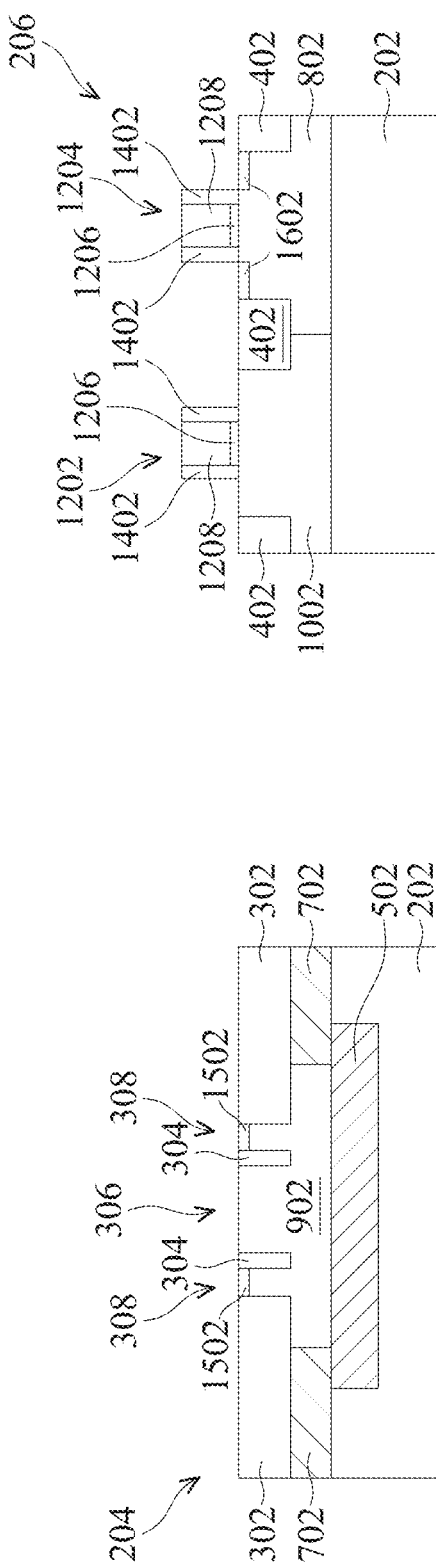
FIG. 15B
FIG. 16B

SCHOTTKY DIODE AND METHOD OF FABRICATION THEREOF

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

One particular semiconductor device of interest is the Schottky barrier diode, which exhibits a low forward voltage drop, very fast switching speeds, and low power consumption. Schottky barrier diodes include a metal layer in contact with a semiconductor surface. By way of example, a Schottky diode may include a metal silicide layer in contact with a well region, such as an N-well region, of a silicon substrate to form a contact region having a Schottky barrier height. The Schottky barrier height is a key performance indicator for Schottky barrier diodes. In some cases, a lower Schottky barrier height can provide higher forward current, but this may also result in a higher reverse bias current. In addition, parasitic resistance at the Schottky contact region may adversely affect device cut-off frequency and increase energy loss. Thus, existing Schottky diodes and their methods of fabrication still present challenges, as existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3B, 4B, 5B, 6B, 7B, 8B, 9B, 10B, 11B, 12B, 13B, 14B, 15B, 16B, 17B, 18B, 19B, and 20B provide cross-sectional views of the semiconductor device 200 at various stages of fabrication according to one or more steps of the method of FIG. 1, in accordance with some embodiments;

FIGS. 3A, 4A, 5A, 6A, 7A, 8A, 9A, 10A, 11A, 12A, 13A, 14A, 15A, 16A, 17A, 18A, 19A, and 20A provide top-down views of the semiconductor device 200 at various stages of fabrication according to one or more steps of the method of FIG. 1, in accordance with some embodiments;

DETAILED DESCRIPTION

Figure 1:
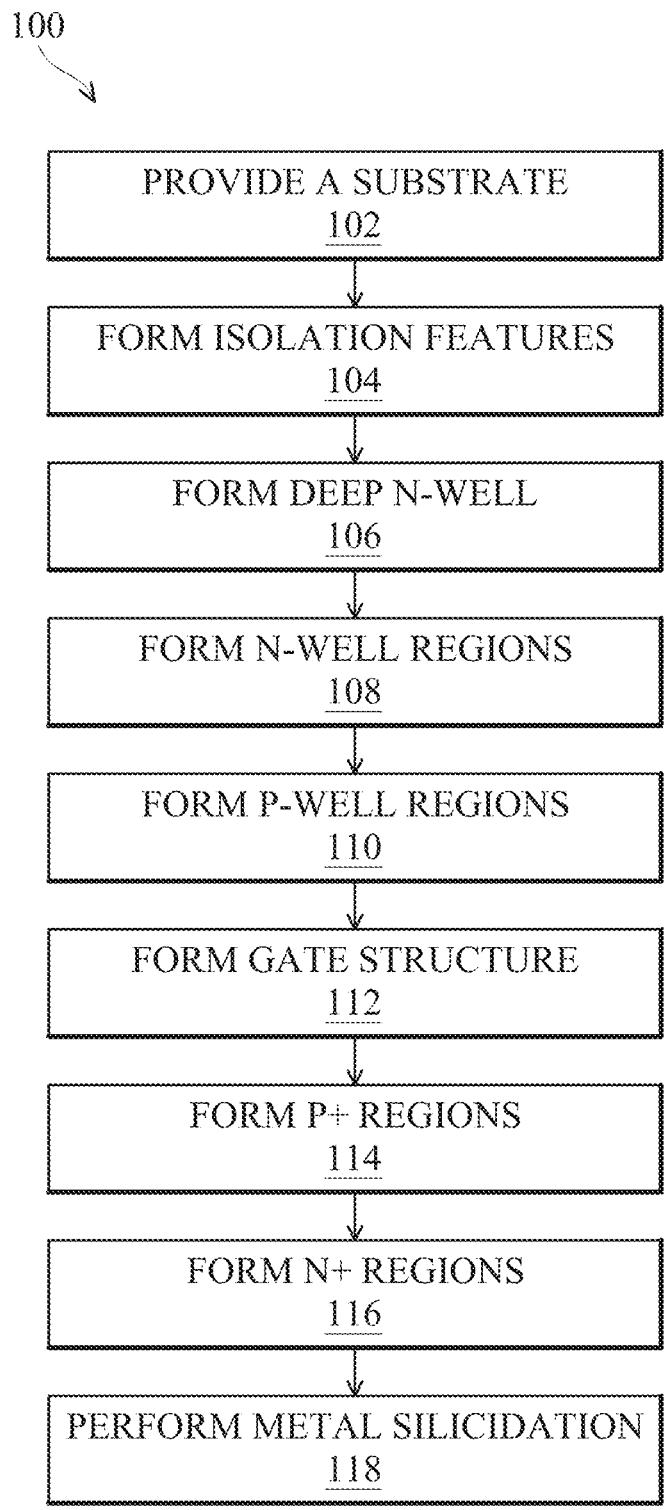
FIG. 1 is a flow chart of a method of fabricating a semiconductor device 200, in accordance with some embodiments.
Figure 2:
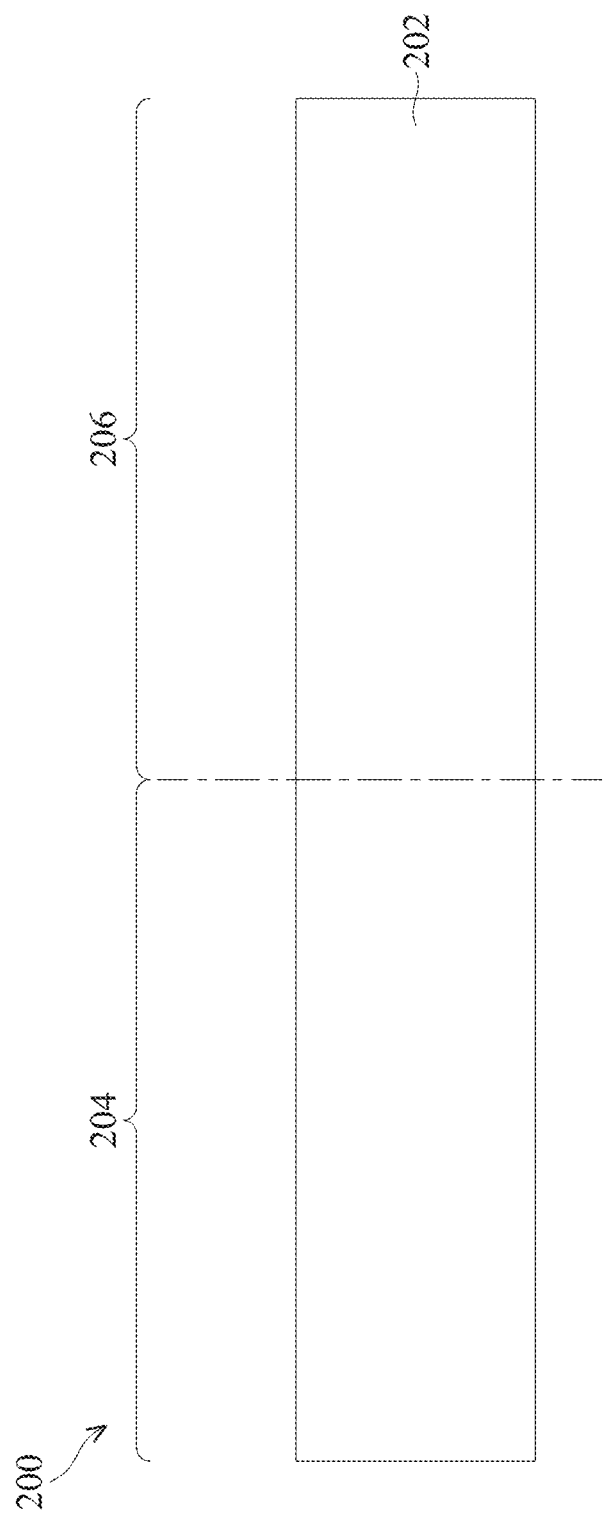
Figure 6A:
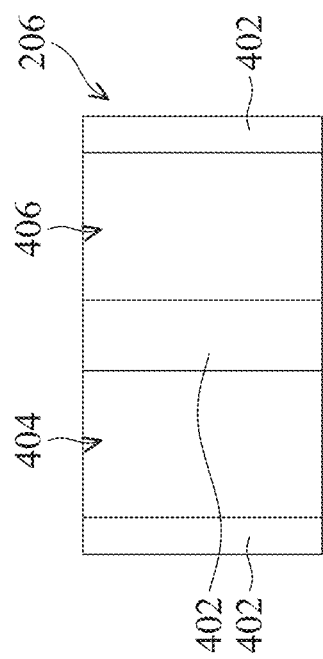
Figure 6B:
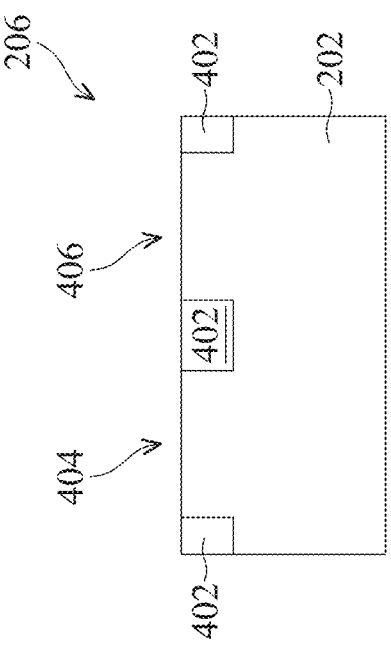
Figure 5A:
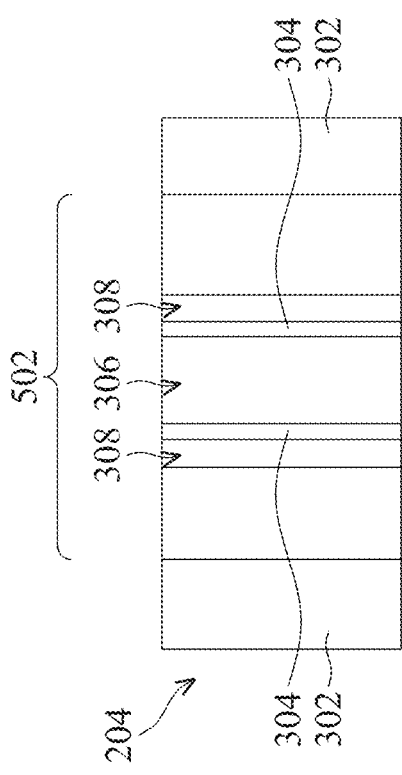
Figure 5B:
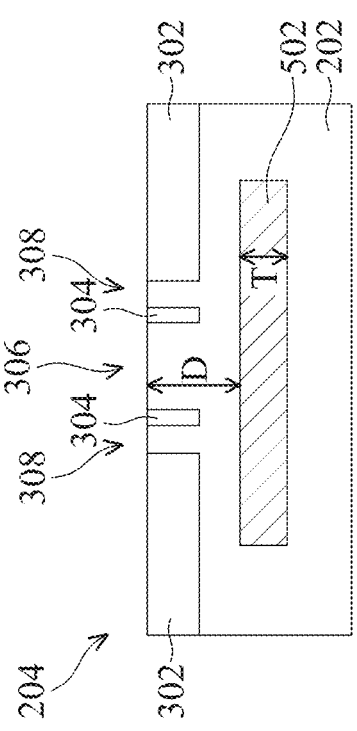
Figure 7A:
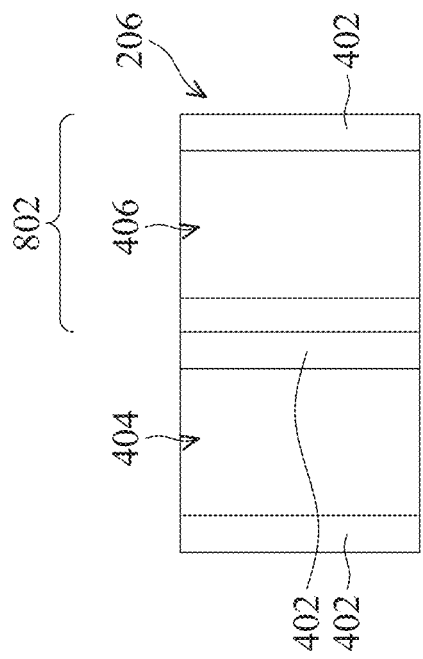
Figure 8A:
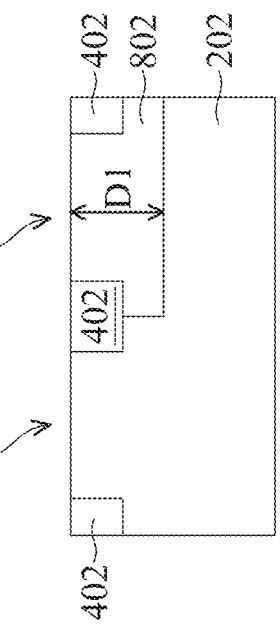
Figure 7B:
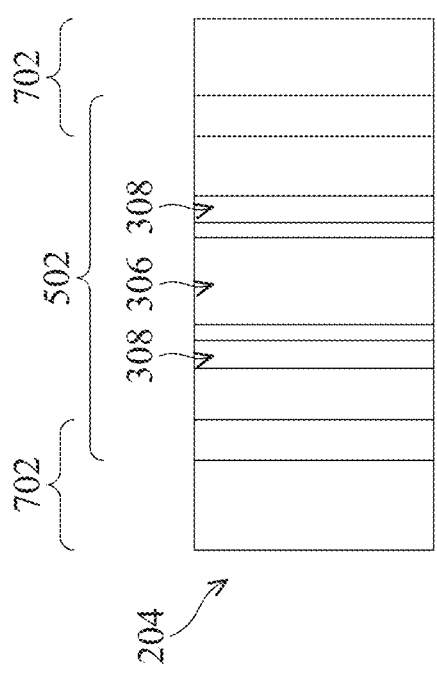
Figure 8B:
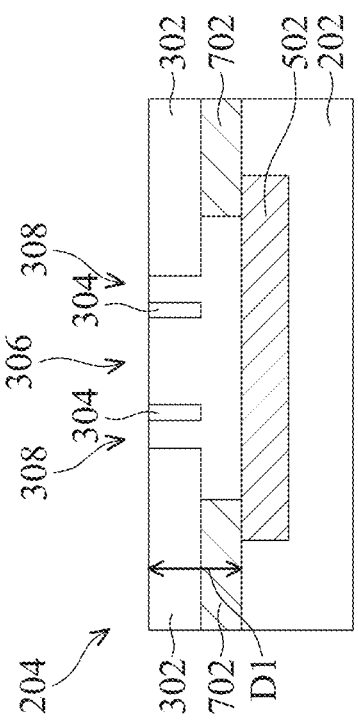
Figure 10A:
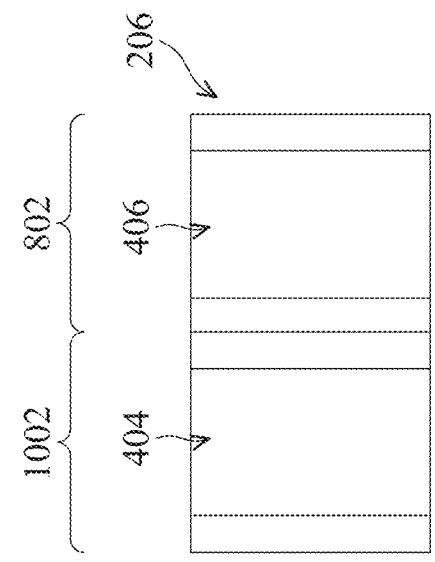
Figure 10B:
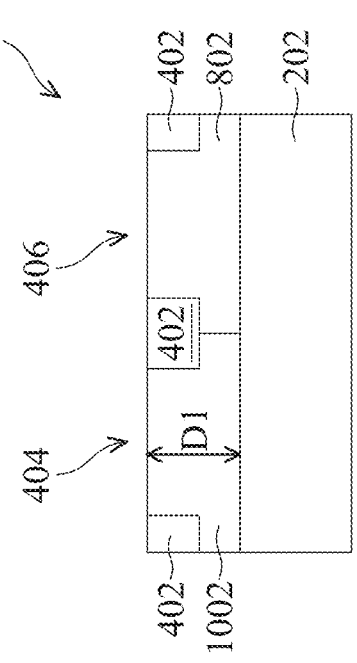
Figure 9A:
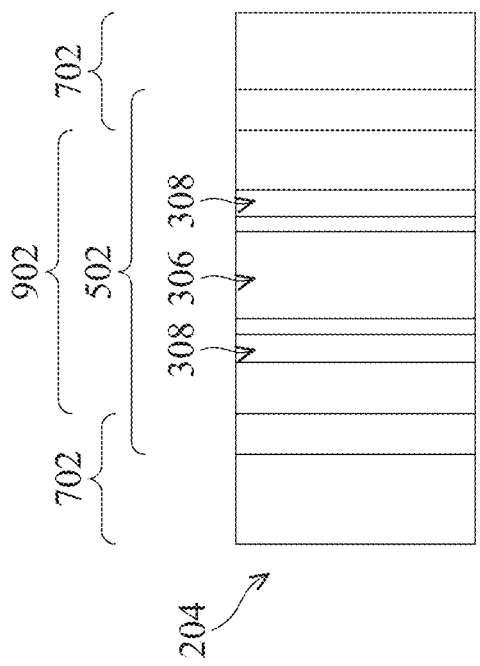
Figure 9B:
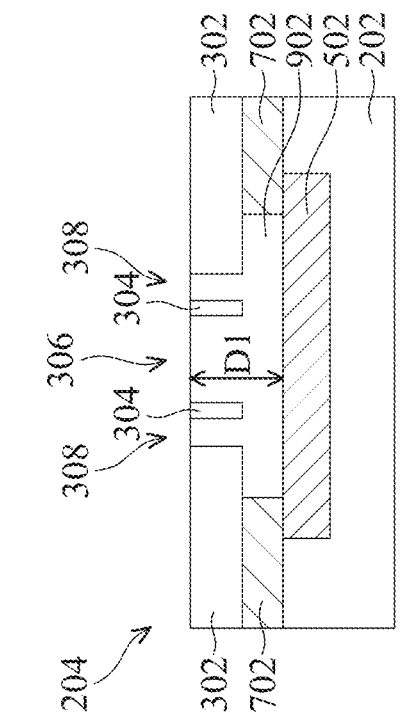
Figure 13A:
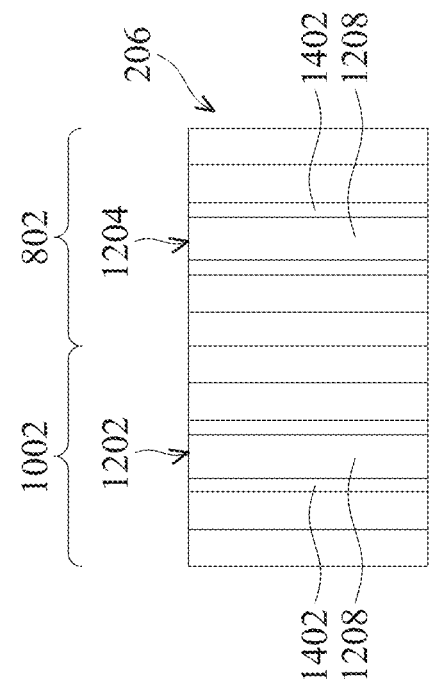
Figure 14A:
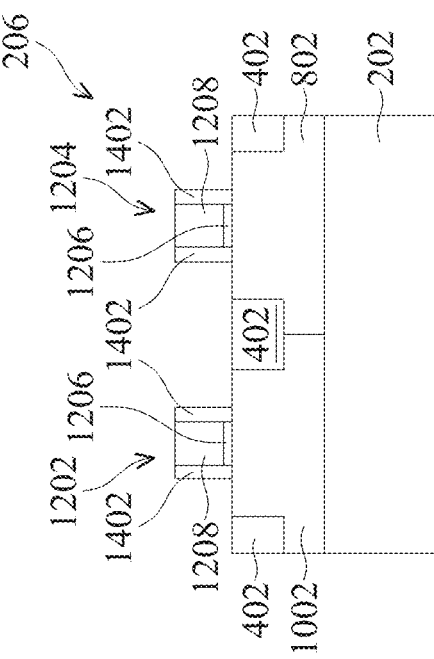
Figure 13B:
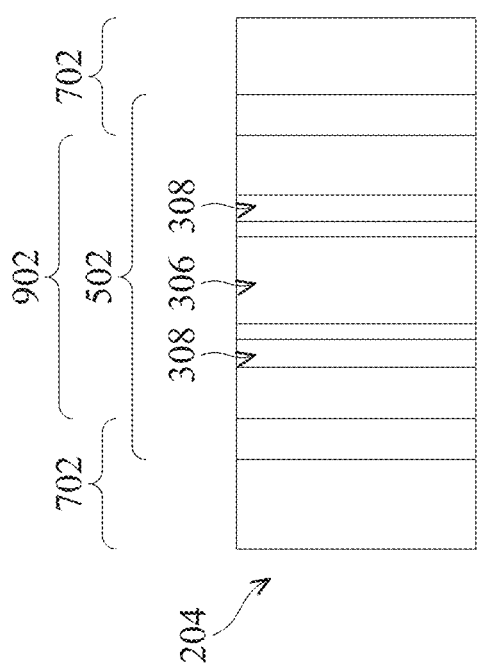
Figure 14B:
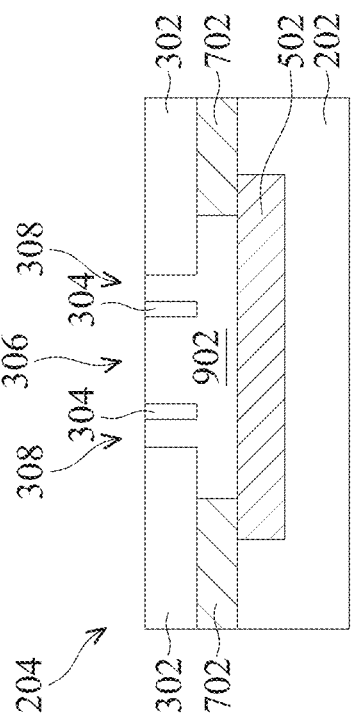
Figure 17A:
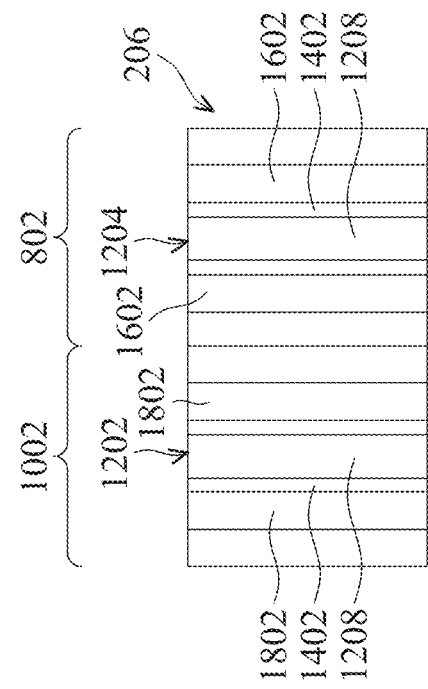
Figure 17B:
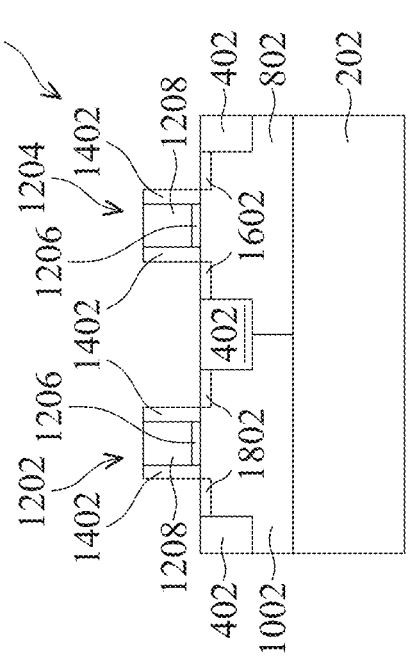
Figure 18A:
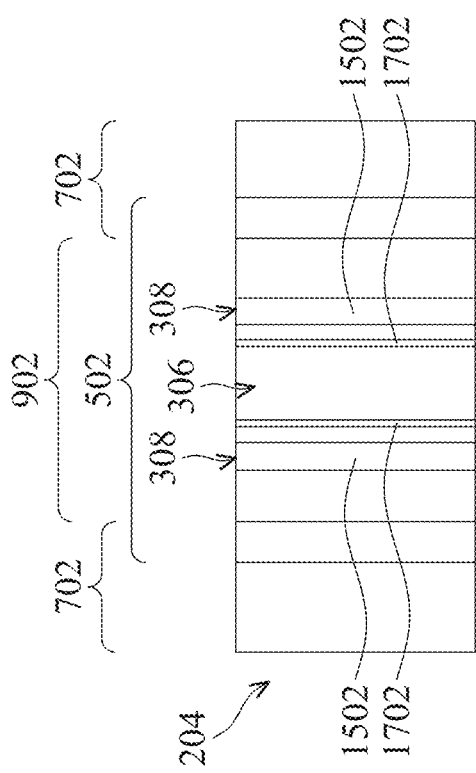
Figure 18B:
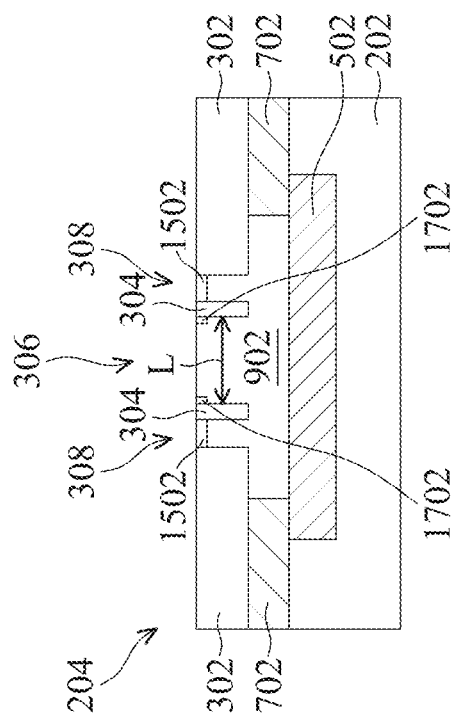
Figure 19A:
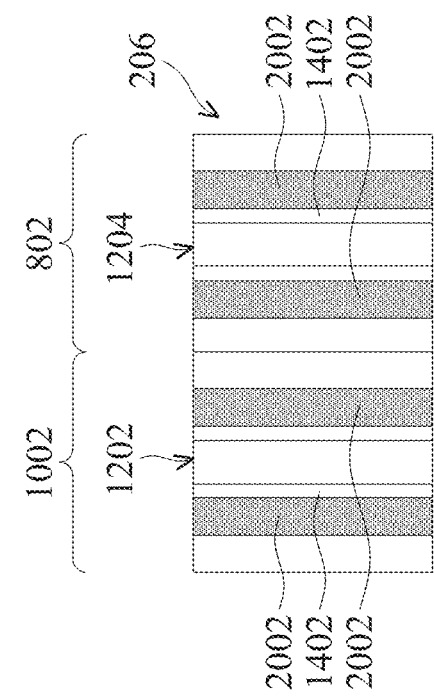
Figure 20A:
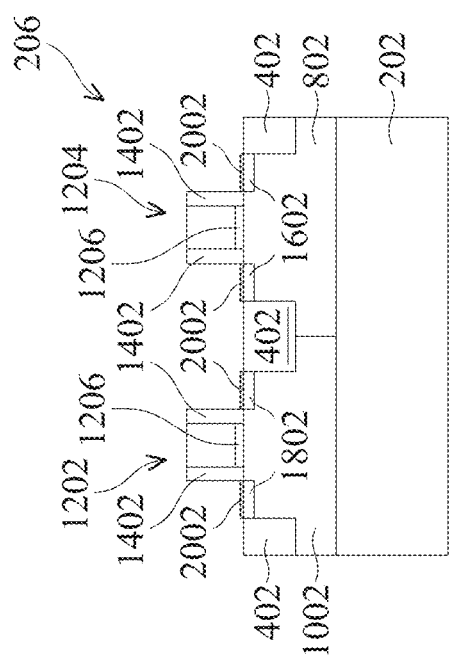
Figure 19B:
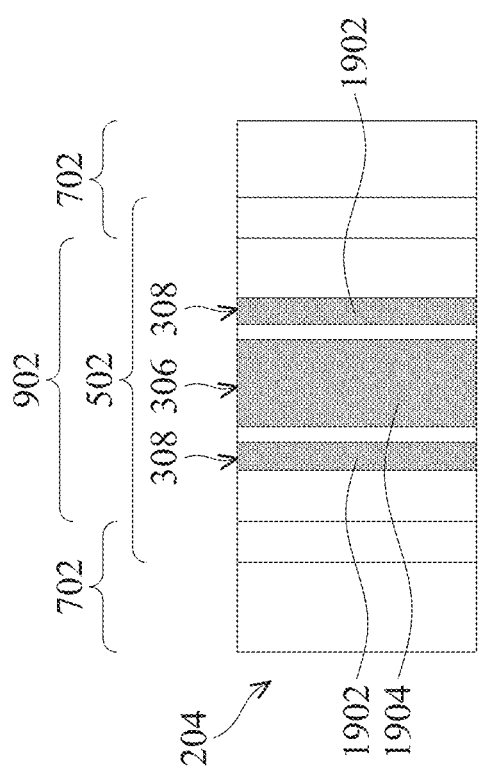
Figure 20B:
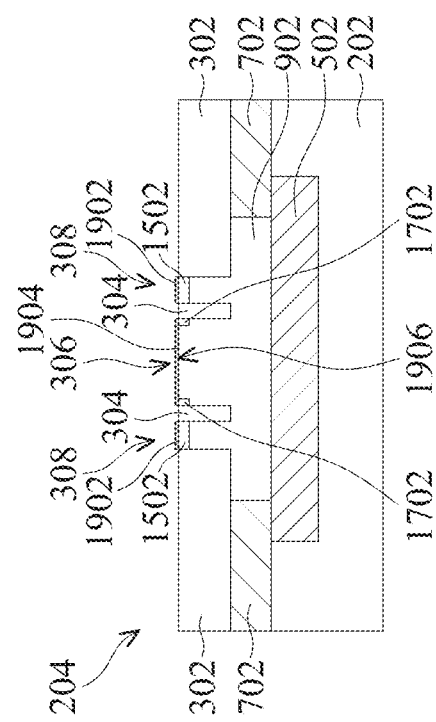

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Additionally, in the discussion that follows, dimensions (e.g., such as thickness, width, length, etc.) for a given layer or other feature may at times be described using terms such as "substantially equal", "equal", or "about", where such terms are understood to mean within +/−10% of the recited value or between compared values. For instance, if dimension A is described as being "substantially equal" to dimension B, it will be understood that dimension A is within +/−10% of dimension B. As another example, if a layer is described as having a thickness of about 100 nm, it will be understood that the thickness of the layer may in a range between 90-110 nm.

As noted above, a particular semiconductor device of interest is the Schottky barrier diode, which exhibits a low forward voltage drop, very fast switching speeds, and low power consumption. Schottky barrier diodes include a metal layer in contact with a semiconductor surface. By way of example, a Schottky diode may include a metal silicide layer in contact with a well region, such as an N-well region, of a silicon substrate to form a contact region having a Schottky barrier height. The Schottky barrier height is a key performance indicator for Schottky barrier diodes. In some cases, a lower Schottky barrier height can provide higher forward current, but this may also result in a higher reverse bias current. In addition, parasitic resistance at the Schottky contact region may adversely affect device cut-off frequency and increase energy loss. Thus, existing Schottky diodes and their methods of fabrication still present challenges, as existing techniques have not proved entirely satisfactory in all respects.

Embodiments of the present disclosure offer advantages over the existing art, though it is understood that other embodiments may offer different advantages, not all advantages are necessarily discussed herein, and no particular advantage is required for all embodiments. For example, embodiments discussed herein include device structures and methods for fabrication of Schottky barrier diodes that address various existing challenges, as discussed above. The methods and Schottky diodes described herein, in some embodiments, are designed to have a low Schottky barrier height, which provides a low forward turn-on voltage and high forward current. Such devices, by way of example, may be used for radio frequency (RF) energy harvesting applications such as RF identification (RFID) applications, wireless charging of mobile devices, voltage doubler RF-to-DC rectifiers, and other related applications. While Schottky diodes may often include a metal silicide layer in contact with an N-well region, embodiments of the present disclosure include a metal silicide layer in contact with a P-well region, which exhibits a lower Schottky barrier height than contact to an N-well region. In some embodiments, the metal silicide layer may include Ni silicide or Co silicide, or other metal silicide layer. Due to the lower Schottky barrier height formed by contacting the P-well region, embodiments of the present disclosure further provide higher forward current.

Embodiments disclosed herein also provide structural features to minimize increases in reverse bias current that are often associated with lower Schottky barrier heights. For instance, various embodiments utilize shallow trench isolation (STI) regions, and a floating (not electrically connected) N-well/deep N-well/N-well structure to provide a contiguous isolation structure that effectively isolates the Schottky barrier diode. The Schottky barrier diodes disclosed herein may also be formed having a finger-type structure. In particular, the anode and cathode of the Schottky barrier diodes may be formed as interdigitated finger structures. By increasing the number of fingers, the Schottky diode width and associated forward current may be increased, in accordance with design specifications. The various embodiments described herein also provide for a higher device cut-off frequency and lower energy loss (e.g., as compared to as least some existing implementations). Additionally, the Schottky diodes disclosed herein may be integrated on the same substrate on which logic devices, or other semiconductor devices, are formed. In view of these various features and advantages, the Schottky barrier diodes disclosed herein may achieve desired performance and reliability metrics. Additional embodiments and advantages are discussed below and/or will be evident to those skilled in the art in possession of this disclosure.

Referring now to FIG. 1, illustrated is a method 100 of fabricating a semiconductor device 200 including a Schottky barrier diode, in accordance with one or more embodiments. The method 100 is discussed below with reference to FIGS. 2 and 3B-20B, which provide cross-section views of the semiconductor device 200, and with reference to FIGS. 3A-20A, which provide top-down views of the semiconductor device 200, at various stages of fabrication, according to one or more steps of the method 100. It is understood that the method 100 includes steps having features of a complementary metal-oxide-semiconductor (CMOS) technology process flow and thus, are only described briefly herein. Also, additional steps may be performed before, after, and/or during the method 100, and some process steps may be replaced or eliminated, without departing from the scope of the present disclosure.

In addition, the semiconductor device 200 may include various other devices and features, including other types of devices such as planar MOSFETs, FinFETs, GAA transistors, strained-semiconductor devices, SOI devices, charge-coupled devices, CMOS sensors, photodiodes, other optical devices, bipolar junction transistors, resistors, capacitors, inductors, diodes, fuses, memory devices such as static random access memory (SRAM) devices, I/O transistors, other logic devices and/or circuits, etc., but is simplified for a better understanding of the inventive concepts of the present disclosure. In some embodiments, the semiconductor device 200 includes a plurality of semiconductor devices (e.g., transistors), including P-type transistors, N-type transistors, etc., which may be interconnected. Moreover, it is noted that the process steps of method 100, including any descriptions given with reference to the figures are merely exemplary and are not intended to be limiting beyond what is specifically recited in the claims that follow.

The method 100 begins at block 102 where a substrate is provided. Referring to the example of FIG. 2, in an embodiment of block 102, a substrate 202 is provided. In some embodiments, the substrate 202 may be a semiconductor substrate such as a silicon substrate. The substrate 202 may include various layers, including conductive or insulating layers formed on a semiconductor substrate. The substrate 202 may include various doping configurations depending on design requirements as is known in the art. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) structure, and/or have other suitable enhancement features.

For purposes of the discussion that follows, the substrate 202 is a P-doped silicon substrate. P-type dopants that the substrate 202 are doped with include boron, gallium, indium, other suitable p-type dopants, or combinations thereof. Because the depicted semiconductor device 200 includes a P-doped substrate, doping configurations described below should be read consistent with a P-doped substrate. The semiconductor device 200 may alternatively include an N-doped substrate, in which case, the doping configurations described below should be read consistent with an N-doped substrate (e.g., read with doping configurations having an opposite conductivity). N-type dopants that the substrate 202 can be doped with include phosphorus, arsenic, other suitable N-type dopants, or combinations thereof.

In some embodiments, the substrate 202 also includes a Schottky barrier diode (SBD) region 204 and a logic region 206 adjacent to the SBD region 204. By way of example, the SBD region 204 may include one or more Schottky barrier diodes. In some embodiments, the logic region 206 may generally include core (logic) transistors and circuits. In at least some examples, devices and/or circuits within the logic region 206 may include planar MOSFETs, FinFETs, GAA transistors, CMOS transistors, strained-semiconductor devices, SOI devices, bipolar junction transistors, resistors, capacitors, inductors, diodes, fuses, memory devices such as SRAM devices, I/O transistors, and/or other logic devices and/or circuits. In some cases, one or more devices within the logic region 206 may be coupled to one or more devices in the SBD region 204, for example, to collectively define an RF energy harvesting circuit such as an RFID circuit, a circuit for wirelessly charging mobile devices, a voltage doubler RF-to-DC rectifier circuit, or other energy harvesting circuit.

For the remainder of the discussion of the method 100, the SBD region 204 and the logic region 206 of the semiconductor device 200, while formed on the same substrate 202, are illustrated in separate figures. Fabrication of the SBD region 204 of the device 200, according to one or more steps of the method 100, is shown and discussed with reference to FIGS. 3A/3B, 5A/5B, 7A/7B, 9A/9B, 11A/11B, 13A/13B, 15A/15B, 17A/17B, and 19A/19B. Fabrication of the logic region 206 of the device 200, according to one or more steps of the method 100, is shown and discussed with reference to FIGS. 4A/4B, 6A/6B, 8A/8B, 10A/10B, 12A/12B, 14A/14B, 16A/16B, 18A/18B, and 20A/20B. However, while fabrication of the SBD region 204 and the logic region 206 is shown in separate figures, discussion of particular ones of the steps of the method 100 may include discussion, in tandem, of figures associated with respective ones of both the SBD region 204 and the logic region 206.

The method 100 proceeds to block 104 where isolation features are formed. Referring to the example of FIGS. 3A/3B and 4A/4B, in an embodiment of block 104, isolation features 302, 304 are formed in the SBD region 204 of the substrate 202, and isolation features 402 are formed in the logic region 206 of the substrate 202. In some examples, the isolation features 302, 304, and 402 may be formed simultaneously. The isolation features 302, 304, 402 are formed in the substrate 202 to isolate various active (OD) regions of the substrate 202. The isolation features 302, 304, 402 may also isolate the semiconductor device 200 from other devices (not shown). In the SBD region 204, the isolation features 302 may isolate one Schottky barrier diode from another Schottky barrier diode or from other devices formed on the substrate 202, while the isolation features 304 serve to define and isolate a cathode region 306 of a Schottky barrier diode from anode regions 308 of the Schottky barrier diode formed on either side of the cathode region 306. Thus, in the depicted embodiment, the Schottky barrier diode in the SBD region 204 will have one cathode finger and two anode fingers. To be sure, embodiments of the present disclosure are not limited by the number of cathode and/or anode fingers, and different numbers of cathode and/or anode fingers may equally be used, as discussed in more detail below. In the logic region 206, the isolation features 402 may isolate one logic device from another logic device or from other devices formed on the substrate 202, and/or the isolation features 402 may isolate an N-type device region 404 (e.g., formed over a P-well) from a P-type device region 406 (formed over an N-well).

In the depicted embodiment, the isolation features 302, 304, 402 are shallow trench isolation (STI) features. Alternatively, the isolation features 302, 304, 402 may include local oxidation of silicon (LOCOS) features or other suitable isolation feature. The isolation features 302, 304, 402 may be composed of silicon oxide, silicon nitride, silicon oxynitride, fluorine-doped silicate glass (FSG), a low-K dielectric, combinations thereof, and/or other suitable material known in the art. The isolation features 302, 304, 402 are formed by a suitable process. As one example, forming STI features includes a photolithography process, etching trenches in the substrate 202 (e.g., by using a dry etching and/or wet etching), and filling the trenches (e.g., by using a chemical vapor deposition process) with one or more dielectric materials. For example, the filled trenches may include a multilayer structure such as a thermal oxide liner layer filled with silicon nitride or silicon oxide. In another example, the STI features may be formed using a processing sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with oxide, using chemical mechanical polishing (CMP) processing to etch back and planarize, and using a nitride stripping process to remove the silicon nitride.

The method 100 proceeds to block 106 where a deep N-well region is formed. Referring to the example of FIGS. 5A/5B and 6A/6B, in an embodiment of block 106, a deep N-well (DNW) region 502 is formed in the SBD region 204 of the substrate 202, but not in the logic region 206 of the substrate 202. The DNW region 502 may be equivalently referred to as an N-type buried layer. It is noted that N-type regions and P-type regions within the substrate 202 may be described as having different conductivity types (e.g., an N-type conductivity and a P-type conductivity). In some embodiments, the DNW region 502 is floating and provides part of a contiguous isolation structure, together with the isolation features 302 and N-well regions 702 (discussed below), to effectively isolate the Schottky barrier diode formed in the SBD region 204.

In an embodiment of block 106, a photolithography process is performed to define a patterned photoresist (resist) layer through which an ion implantation process is subsequently performed to form the DNW region 502. As part of the photolithography process, a photoresist layer is initially deposited over the semiconductor device 200 (e.g., by spin-on coating), after which one or more other photolithography processing steps may be performed such as soft baking, mask aligning, exposure, post-exposure baking, developing, rinsing, drying (e.g., spin-drying and/or hard baking), other suitable photolithography processing steps, and/or combinations thereof. As a result of the photolithography process, the patterned resist layer is formed. In an embodiment, the patterned resist layer substantially covers an entirety of the logic region 206 of the substrate 202. The patterned resist layer also partially covers the SBD region 204, except for an opening in patterned resist layer in the SBD region 204, through which the ion implantation process is subsequently performed to form the DNW region 502.

In a further embodiment of block 106, the DNW region 502 is implanted deeply within the substrate 202, using an ion implantation process, through openings in the patterned resist layer. For example, the DNW region 502 is implanted in the substrate 202 at a depth "D" from a top surface of the substrate 202. In the depicted embodiment, the DNW region 502 is at a depth of about 4 μm to about 6 μm. A thickness "T" of the DNW region 502 is about 0.5 μm to about 4 μm, and a doping concentration of the DNW region 502 is about $1 \times 10^{15}$ atoms/cm$^3$ to about $1 \times 10^{17}$ atoms/cm$^3$. The DNW region 502 is formed by implanting the substrate 202 with an N-type dopant, such as phosphorous or arsenic, and subjecting the DNW region 502 to an annealing process, such as a rapid thermal anneal or laser anneal. Alternatively, the DNW region 502 may be formed by another suitable process, such as a diffusion process. After formation of the DNW region 502, the patterned resist layer is removed (e.g., using a solvent or ashing process).

The method 100 proceeds to block 108 where N-well regions are formed. Referring to the example of FIGS. 7A/7B and 8A/8B, in an embodiment of block 108, N-well regions 702 are formed in the SBD region 204 of the substrate 202 beneath the isolation features 302, and N-well regions 802 are formed in the P-type device region 406 of the logic region 206 of the substrate 202. In some examples, the N-well regions 702, 802 may be formed simultaneously. The N-well regions 702 are floating and provide part of the contiguous isolation structure, together with the isolation features 302 and DNW region 502 (discussed above), to effectively isolate the Schottky barrier diode formed in the SBD region 204.

In an embodiment of block 108, a photolithography process is performed to define a patterned resist layer through which an ion implantation process is subsequently performed to form the N-well regions 702, 802. The photolithography process and formation of the patterned resist layer may be similar to the method described above with respect to the DNW region 502. In an embodiment, the patterned resist layer covers P-well regions in each of the SBD region 204 and the logic region 206, while providing openings through which the ion implantation process is subsequently performed to form the N-well regions 702, 802.

In a further embodiment of block 108, the N-well regions 702, 802 are implanted within the substrate 202, using an ion implantation process, through openings in the patterned resist layer. In an example, the N-well regions 702 are further implanted through the isolation features 302 and into the substrate 202 such that they extend from the top surface of the substrate 202 (or from the top surface of the isolation features 302) a distance "D1" into the substrate 202. In the depicted embodiment, the N-well regions 702 extend a distance into the substrate 202 that is about equal to the depth of the DNW region 502, for example, about 4 µm to about 6 µm. Similarly, the N-well region 802 is implanted into the substrate 202, and in some cases through portions of adjacent isolation features 402, such that it extends from the top surface of the substrate 202 the distance "D1" into the substrate 202. Thus, in the depicted embodiment, the N-well region 802 also extends a distance into the substrate 202 from about 4 µm to about 6 µm. In some embodiments, a doping concentration of the N-well regions 702, 802 is about $1 \times 10^{16}$ atoms/cm$^3$ to about $1 \times 10^{18}$ atoms/cm$^3$. In addition, the N-well regions 702 are adjacent to the DNW region 502, and portions of the N-well regions 702 abut or overlap the DNW region 502 to provide the contiguous isolation structure, as described above. The N-well regions 702, 802 are formed by implanting the substrate 202 with an N-type dopant, such as phosphorous or arsenic, and subjecting the N-well regions 702, 802 to an annealing process, such as a rapid thermal anneal or laser anneal. Alternatively, the N-well regions 702, 802 are formed by another suitable process, such as a diffusion process. After formation of the N-well regions 702, 802, the patterned resist layer is removed (e.g., using a solvent or ashing process).

The method 100 proceeds to block 110 where P-well regions are formed. Referring to the example of FIGS. 9A/9B and 10A/10B, in an embodiment of block 110, P-well regions 902 are formed in the SBD region 204 of the substrate 202, for example in the cathode region 306 and the anode regions 308, and P-well regions 1002 are formed in the N-type device region 404 of the logic region 206 of the substrate 202. In some examples, the P-well regions 902, 1002 may be formed simultaneously. In an embodiment, a Schottky barrier diode is formed in the P-well region 902, as described herein. For example, a cathode of the Schottky barrier diode is defined in the cathode region 306 of the P-well region 902, and an anode of the Schottky barrier diode is defined in the anode regions 308 of the P-well region 902 on either side of the cathode region 306. The cathode region 306 is separated from the anode regions 308 by the isolation structures 304, as discussed above.

In an embodiment of block 110, a photolithography process is performed to define a patterned resist layer through which an ion implantation process is subsequently performed to form the P-well regions 902, 1002. The photolithography process and formation of the patterned resist layer may be similar to the method described above with respect to the DNW region 502. In an embodiment, the patterned resist layer covers the N-well regions 702, 802 in each of the SBD region 204 and the logic region 206, while providing openings through which the ion implantation process is subsequently performed to form the P-well regions 902, 1002.

In a further embodiment of block 110, the P-well regions 902, 1002 are implanted within the substrate 202, using an ion implantation process, through openings in the patterned resist layer. In an example, the P-well region 902 is implanted into the substrate 202, through the isolation features 304 and in some cases through portions of the isolation features 302, such that they extend from the top surface of the substrate 202 the distance "D1" into the substrate 202. Thus, in the depicted embodiment, the P-well regions 902 extend a distance into the substrate 202 that is about equal to the depth of the DNW region 502, for example, about 4 µm to about 6 µm. Similarly, the P-well region 1002 is implanted into the substrate 202, and in some cases through portions of adjacent isolation features 402, such that it extends from the top surface of the substrate 202 the distance "D1" into the substrate 202. Thus, in the depicted embodiment, the P-well region 1002 also extends a distance into the substrate 202 from about 4 µm to about 6 µm. In some embodiments, a doping concentration of the P-well regions 902, 1002 is about $1 \times 10^{16}$ atoms/cm$^3$ to about $1 \times 10^{18}$ atoms/cm$^3$. In addition, the P-well region 902 is adjacent to both the DNW region 502 and the N-well regions 702, and portions of the P-well region 902 abut or overlap each of the DNW region 502 and the N-well regions 702. The P-well regions 902, 1002 are formed by implanting the substrate 202 with a P-type dopant, such as boron, gallium, indium, other suitable p-type dopants, or combinations thereof, and subjecting the P-well regions 902, 1002 to an annealing process, such as a rapid thermal anneal or laser anneal. Alternatively, the P-well regions 902, 1002 are formed by another suitable process, such as a diffusion process. After formation of the P-well regions 902, 1002, the patterned resist layer is removed (e.g., using a solvent or ashing process).

The method 100 proceeds to block 112 where a gate structure is formed. Referring to the example of FIGS. 11A/11B and 12A/12B, in an embodiment of block 112, gate structures 1202, 1204 are formed in the logic region 206 of the substrate 202, but not in the SBD region 204. In some examples, the gate structures 1202, 1204 may be formed simultaneously. The gate structure 1202 provides a gate for an N-type transistor formed in the N-type device region 404, and the gate structure 1204 provides a gate for a P-type transistor formed in the P-type device region 406. By way of example, the N-type transistor and the P-type transistor may collectively define a CMOS device.

In various examples, each of the gate structures 1202, 1204 may include a gate dielectric 1206 and a gate electrode 1208 over the gate dielectric 1206. In some embodiments, the gate dielectric 1206 may include an interfacial layer such as silicon oxide layer ($SiO_2$) or silicon oxynitride (SiON). In some examples, the gate dielectric 1206 may further include a high-K dielectric layer, such as hafnium oxide ($HfO_2$), formed over the interfacial layer. In some cases, the high-K dielectric layer may include other high-k dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. High-K gate dielectrics, as used and described herein, include dielectric materials having a high dielectric constant, for example, greater than that of thermal silicon oxide (~3.9). In still other embodiments, the gate dielectric 1206 may include silicon dioxide or other suitable dielectric.

In some embodiments, the gate electrode 1208 may be deposited as part of a gate first or gate last (e.g., replacement gate) process, and the gate electrode 1208 may include a conductive layer such as W, Ti, TiN, TiAl, TiAlN, Ta, TaN, WN, Re, Ir, Ru, Mo, Al, Cu, Co, CoSi, Ni, NiSi, combinations thereof, and/or other suitable compositions. In some examples, the gate electrode 1208 may include a first metal material for the N-type transistor formed in the N-type device region 404 and a second metal material for the P-type transistor formed in the P-type device region 406. Thus, the N-type transistor and the P-type transistor may include a dual work-function metal gate configuration. For example, the first metal material (e.g., for the N-type transistor) may include metals having a work function substantially aligned with a work function of the substrate conduction band, or at least substantially aligned with a work function of the conduction band of a channel region of the N-type transistor. Similarly, the second metal material (e.g., for the P-type transistor) may include metals having a work function substantially aligned with a work function of the substrate valence band, or at least substantially aligned with a work function of the valence band of a channel region of the P-type transistor. Thus, the gate electrode 1208 of the gate structures 1202, 1204 may provide a gate electrode for both N-type transistors and P-type transistors. In some embodiments, the gate electrode 1208 may alternately or additionally include a polysilicon layer.

In a further embodiment of block 112, sidewall spacers may be formed on sidewalls of the gate structures 1202, 1204. However, in various examples, after forming the gate structures 1202, 1204 and prior to forming the sidewall spacers, lightly-doped drain (LDD) regions may be formed in the logic region 206 while masking the SBD region 204 (e.g., using a patterned resist layer). For instance, in some embodiments, an N-type LDD (NLDD) region may be formed in the N-type device region 404, specifically in the P-well region 1002 of the substrate 202 adjacent to and on either side of the gate structure 1202. Similarly, in some embodiments, a P-type LDD (PLDD) region may be formed in the P-type device region 406, specifically in the N-well region 802 of the substrate 202 adjacent to and on either side of the gate structure 1204. In various embodiments, the NLDD and PLDD regions may be formed by diffusion, ion implantation, or other suitable method. After forming the NLDD and PLDD regions, and with reference to the example of FIGS. 13A/13B and 14A/14B, sidewall spacers 1402 are formed in the logic region 206 of the substrate 202, but not in the SBD region 204. For instance, sidewall spacers 1402 may be formed on sidewalls of the gate structures 1202, 1204. In some embodiments, the sidewall spacers 1402 may include a dielectric material such as silicon oxide, silicon nitride, silicon carbide, silicon oxynitride, or combinations thereof.

The method 100 proceeds to block 114 where P+ regions are formed. Referring to the example of FIGS. 15A/15B and 16A/16B, in an embodiment of block 114, P+ regions 1502 are formed in the SBD region 204 of the substrate 202, for example in the anode regions 308, and P+ regions 1602 are formed in the P-type device region 406 of the logic region 206 of the substrate 202, for example in the N-well region 802 of the substrate 202 adjacent to and on either side of the gate structure 1204. In some examples, the P+ regions 1502, 1602 may be formed simultaneously. As previously discussed, a Schottky barrier diode is formed in the P-well region 902, and the P+ regions 1502 provide low-resistance (ohmic) contact regions to the anode of the Schottky barrier diode in the anode regions 308 of the P-well region 902 on either side of the cathode region 306. The P+ regions 1602 provide low-resistance (ohmic) contact regions in source/drain regions of the P-type transistor in the P-type device region 406.

In some examples, the P+ regions 1502, 1602 are heavily doped with a P-type dopant, such as boron. The P+ regions 1502, 1602 may have a same or different dopant type, doping concentration, and/or doping profile. In some embodiments, each of the P+ regions 1502, 1602 may be formed by diffusion, ion implantation, doped epitaxial growth, or a combination thereof. Each of the P+ regions 1502 in the SBD region 204 is formed between isolation features 302, 304, thus isolating the P+ regions 1502. In the logic region 206, the P+ regions 1602 provide P-type source/drain features for the P-type transistor in the P-type device region 406, where a channel region of the P-type transistor is defined as the region between the P+ regions 1602 under the gate structure 1204, and within the substrate 202.

As part of the process of forming the P+ regions 1502, 1602, a photolithography process may be performed to define a patterned resist layer through which an ion implantation process is subsequently performed to form the P+ regions 1502, 1602. The photolithography process and formation of the patterned resist layer may be similar to the method described above with respect to the DNW region 502. In some embodiments, after forming the patterned resist layer, the P+ regions 1502, 1602 are implanted within the substrate 202, using an ion implantation process, through openings in the patterned resist layer. In some embodiments, a doping concentration of the P+ regions 1502, 1602 is about $1 \times 10^{18}$ atoms/$cm^3$ to about $1 \times 10^{20}$ atoms/$cm^3$. The P+ regions 1502, 1602 may be formed by implanting the substrate 202 with a P-type dopant, such as boron, gallium, indium, other suitable P-type dopants, or combinations thereof, and subjecting the P+ regions 1502, 1602 to an annealing process, such as a rapid thermal anneal or laser anneal. Alternatively, the P+ regions 1502, 1602 may be formed by another suitable process, such as a diffusion process. After formation of the P+ regions 1502, 1602, the patterned resist layer is removed (e.g., using a solvent or ashing process).

The method 100 proceeds to block 116 where N+ regions are formed. Referring to the example of FIGS. 17A/17B and 18A/18B, in an embodiment of block 116, N+ regions 1702 are formed in the SBD region 204 of the substrate 202, for example in the cathode region 306, and N+ regions 1802 are formed in the N-type device region 404 of the logic region 206 of the substrate 202, for example in the P-well region 1002 of the substrate 202 adjacent to and on either side of the gate structure 1202. In some examples, the N+ regions 1702, 1802 may be formed simultaneously. As shown, the N+ regions 1702 are formed at opposing edges of the cathode region 306 in the P-well region 902, rather than across an entire length 'L' of the cathode region 306. The length 'L' of the cathode region 306 may also be described as the length of a cathode finger, as described in more detail below. In some embodiments, a length of the N+ regions 1702 at each opposing edge of the cathode region 306 is less than about 10% of the entire length 'L' of the cathode region 306. The N+ regions 1702, while occupying a small portion of the cathode region 306, are effectively used to reduce junction leakage and edge effects for the Schottky barrier diode. The N+ regions 1802 provide low-resistance (ohmic) contact regions in source/drain regions of the N-type transistor in the N-type device region 404.

In some examples, the N+ regions 1702, 1802 are heavily doped with an N-type dopant, such as phosphorous or arsenic. The N+ regions 1702, 1802 may have a same or different dopant type, doping concentration, and/or doping profile. In some embodiments, each of the N+ regions 1702, 1802 may be formed by diffusion, ion implantation, doped epitaxial growth, or a combination thereof. Each of the N+ regions 1702 in the SBD region 204 is formed at an edge of the cathode region 306 in contact with isolation features 304. In the logic region 206, the N+ regions 1802 provide N-type source/drain features for the N-type transistor in the N-type device region 404, where a channel region of the N-type transistor is defined as the region between the N+ regions 1802 under the gate structure 1202, and within the substrate 202.

As part of the process of forming the N+ regions 1702, 1802, a photolithography process may be performed to define a patterned resist layer through which an ion implantation process is subsequently performed to form the N+ regions 1702, 1802. The photolithography process and formation of the patterned resist layer may be similar to the method described above with respect to the DNW region 502. In some embodiments, after forming the patterned resist layer, the N+ regions 1702, 1802 are implanted within the substrate 202, using an ion implantation process, through openings in the patterned resist layer. In some embodiments, a doping concentration of the N+ regions 1702, 1802 is about $1 \times 10^{18}$ atoms/cm$^3$ to about $1 \times 10^{20}$ atoms/cm$^3$. The N+ regions 1702, 1802 may be formed by implanting the substrate 202 with an N-type dopant, such as such as phosphorous, arsenic, antimony, other suitable N-type dopants, or combinations thereof, and subjecting the N+ regions 1702, 1802 to an annealing process, such as a rapid thermal anneal or laser anneal. Alternatively, the N+ regions 1702, 1802 may be formed by another suitable process, such as a diffusion process. After formation of the N+ regions 1702, 1802, the patterned resist layer is removed (e.g., using a solvent or ashing process).

The method 100 proceeds to block 118 where a metal silicidation process is performed. Referring to the example of FIGS. 19A/19B and 20A/20B, in an embodiment of block 118, metal silicide layers 1902 are formed in the SBD region 204 of the substrate 202, for example in the anode regions 308, a metal silicide layer 1904 is formed in the SBD region 204 of the substrate 202, for example in the cathode region 306, and metal silicide layers 2002 are formed in the N-type device region 404 and P-type device region 406 of the logic region 206 of the substrate 202, for example over source/drain regions of the N-type and P-type transistors. In some examples, two or more of the metal silicide layers 1902, 1904, and 2002 may be formed simultaneously.

The metal silicide layer 1904 in the cathode region 306 is electrically coupled to the P-well region 902, and a Schottky barrier forms at a junction 1906 of the metal silicide layer 1904 and the P-well region 902. In some embodiments, the metal silicide layer 1904 is in contact with the P-well region 902 across the entire length 'L' of the cathode region 306 (e.g., including in contact with the N+ regions 1702). However, in some cases, the metal silicide layer 1904 only contacts a portion of the P-well region 902 between the N+ regions 1702, thus contacting less than the entire length 'L' of the cathode region 306. The metal silicide layer 1902 in the anode regions 308 is electrically coupled to the P+ regions 1502 and forms a low-resistance (ohmic) contact to the anode of the Schottky barrier diode. The metal silicide layers 2002 are electrically coupled to, and provide low-resistance contact to, respective ones of the N+ regions 1802 in the N-type device region 404 and the P+ regions 1602 in the P-type device region 406.

In the depicted embodiment, the metal silicide layers 1902, 1904, and 2002 may include nickel silicide (NiSi) or cobalt silicide (CoSi). Alternatively, in some embodiments, the metal silicide layers 1902, 1904, and 2002 may include titanium silicide (TiSi), platinum silicide (PtSi), tantalum silicide (TaSi), other suitable metal silicide materials, or combinations thereof. The metal silicide layers 1902, 1904, 2002, in some examples, may be formed by a salicide (self-aligned silicidation) process, which includes forming a metal layer (not shown) over the substrate 202, for example over the cathode region 306 and the anode regions 308 of the P-well region 902, over the N+ regions 1802 in the N-type device region 404, and over the P+ regions 1602 in the P-type device region 406. After forming the metal layer, an annealing process is performed to cause a reaction between the metal layer and the underlying silicon. The annealing process utilizes an elevated temperature that is selected based on the composition of the metal layer. The unreacted metal layer is removed thereafter. Additional thermal processes may be implemented to reduce the resistance of the metal silicide. In some embodiments, the metal silicide layer 1904 includes other metal materials suitable for forming a Schottky barrier, such as tungsten, titanium, chromium, silver, palladium, other suitable metal materials, or combinations thereof.

The semiconductor device 200 may undergo further processing to form various features and regions known in the art. For example, subsequent processing may form various contacts/vias/lines and multilayer interconnect features (e.g., metal layers and interlayer dielectrics) on the substrate, configured to connect the various features to form a functional circuit that may include one or more of the semiconductor devices 200. In furtherance of the example, a multilayer interconnection may include vertical interconnects, such as vias or contacts, and horizontal interconnects, such as metal lines. In various embodiments, the vias or contacts may provide an electrical connection to the metal silicide layers 1902, 1904, 2002, and thus an electrical connection to respective ones of the cathode region 306 and the anode regions 308 of the Schottky barrier device, the N+ regions 1802 of the N-type device region 404, and the P+ regions 1602 of the P-type device region 406, as well as providing an electrical connection to the gate electrode 1208 of each of the gate structures 1202, 1204. The various interconnection features may employ various conductive materials including copper, tungsten, and/or silicide. In one example, a damascene and/or dual damascene process is used to form a copper related multilayer interconnection structure.

Figure 21A:
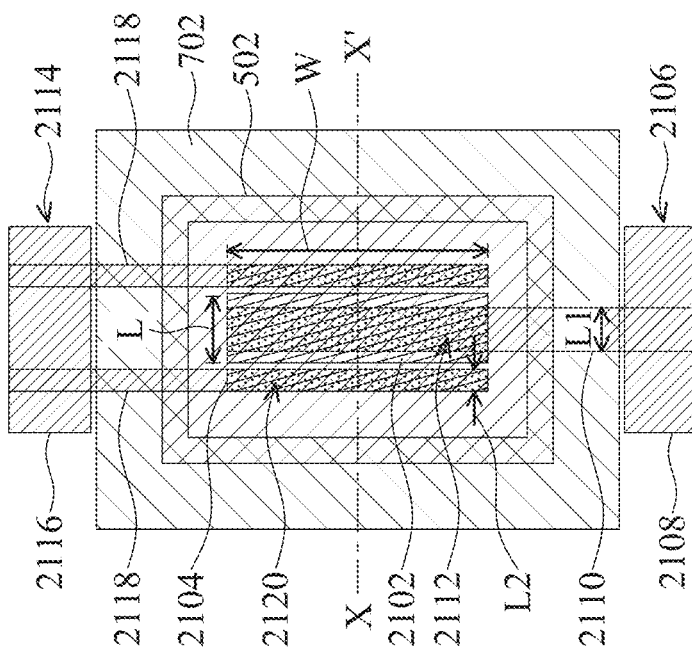
FIG. 21A illustrates a top-down (layout) view of a Schottky barrier device portion of the semiconductor device 200, in accordance with some embodiments.
Figure 21B:
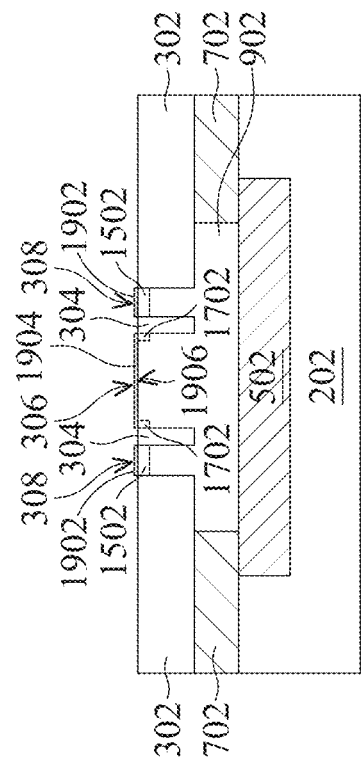
FIG. 21B illustrates a cross-section view of the Schottky barrier device of FIG. 21A, along a plane substantially parallel to the section X-X' of FIG. 21A, in accordance with some embodiments.

Referring now to the example of FIG. 21A, illustrated therein is a top-down (layout) view of the Schottky barrier device formed in the SBD region 204 of the semiconductor device 200. FIG. 21B illustrates a cross-section view of the Schottky barrier device of FIG. 21A, along a plane substantially parallel to the section X-X' of FIG. 21A. It is noted that the cross-section view of FIG. 21B is substantially the same as the illustration of the Schottky barrier device shown in FIG. 19B, discussed above, but is included here for ease of discussion with reference to FIG. 21A.

The example of FIG. 21A illustrates active (OD) regions 2102, 2104, within which the cathode region 306 and the anode regions 308 are formed in the P-well region 902, and which are isolated from each other and/or from other devices by the isolation features 302, 304. In the depicted example, the cathode region 306 is formed within the active region 2102, and the anode regions 308 are formed within the active regions 2104. The DNW region 502 is also illustrated and fully encloses the active regions 2102, 2104 (as shown in the top-down view of FIG. 21A). The N-well regions 702, as shown, circumscribes (as shown in the top-down view of FIG. 21A) and partially overlaps with the DWN region 502 (as shown in the top-down view of FIG. 21A and the cross-section view of FIG. 21B). The N-well regions 702 also circumscribe the P-well region 902. As previously described, the N-well regions 702 are floating and provide part of a contiguous isolation structure, together with the isolation features 302 and the DNW region 502, to effectively isolate the Schottky barrier diode formed in the SBD region 204. In some cases, this contiguous isolation structure may be referred to as a guard ring structure. Moreover, since the Schottky barrier diode is formed within the P-well region 902, the contiguous isolation structure may be said to effectively isolate the P-well region 902.

FIG. 21A further illustrates a cathode 2106 having a common electrode portion 2108 and a finger portion 2110. In some embodiments, the cathode 2106 may be formed in a first metal layer (Ml) and may comprise various conductive materials such as copper, tungsten, and/or silicide. The finger portion 2110 extends over the cathode region 306 in the active region 2102 and electrically connects to the metal silicide layer 1904 by way of metal contacts 2112 formed therebetween, thus providing an electrical connection to the Schottky barrier diode formed in the cathode region 306. In some examples, a length 'L1' of the finger portion 2110 may be less than the length 'L' of the cathode region 306, for example, being equal to the length of the active region 2102. Likewise, a width 'W' of the cathode of the Schottky barrier device is equal to the width of the active region 2102, as shown. In various embodiments, a ratio of the width 'W' to the length 'L' of the cathode of the Schottky barrier device is greater than or equal to 4. By way of example, the length 'L' is equal to about 1 micron. More generally, the length 'L' may be in a range of between about 0.9 microns to about 1.1 microns. In some cases, the width 'W' is in a range of between about 4 microns and 50 microns. As the area ('L'×'W') of the cathode of the Schottky barrier device increases, so does the forward current of the device.

Also shown in FIG. 21A is an anode 2114 having a common electrode portion 2116 and a plurality of finger portions 2118 that are interdigitated with the finger portion 2110 of the cathode 2106. In some embodiments, the anode 2114 may be formed in a first metal layer (Ml) and may comprise various conductive materials such as copper, tungsten, and/or silicide. The plurality of finger portions 2118 extend over the anode regions 308 in the active regions 2104 and electrically connect to the metal silicide layers 1902 by way of metal contacts 2120 formed therebetween, thus providing an electrical connection to the P+ regions 1502 of the Schottky barrier diode formed in the anode regions 308. In some examples, a length 'L2' of each of the finger portions 2118 may be less than the length 'L1' of the finger portion 2110. In the depicted embodiments, the length 'L2' of the anode of the Schottky barrier device is equal to the length of the active region 2104. Likewise, a width 'W' of the anode of the Schottky barrier device is equal to the width of the active region 2104 and may be substantially equal to the width of the cathode, as shown. In some embodiments, the length 'L2' may be in a range of between about 0.2 microns to about 1.5 microns, and the width 'W' is in a range of between about 4 microns and 50 microns, as previously discussed. It is noted however, that because the electrical connections to the anode regions 308 are ohmic contacts, the sizing of the finger portions 2118 is not critical in comparison to the sizing of the finger portion 2110.

In addition to tuning the sizing of the cathode 2106 and the anode 2114 (e.g., especially the finger portions 2110 of the cathode 2106) to achieve a desired device performance (e.g., such as a desired forward current), a number of fingers for each of the cathode 2106 and the anode 2114 may be increased or decreased to further tune the device performance (e.g., forward current). For purposes of this discussion, a number of fingers 'N' of the Schottky barrier diode is defined as a number of cathode fingers (e.g., a number of finger portions 2110). Thus, in the example of FIGS. 21A and 21B, the number of fingers 'N' is equal to 1. However, in some embodiments, the number of fingers 'N' may be greater than 1, as discussed below with reference to FIGS. 22A and 22B.

Figure 22A:
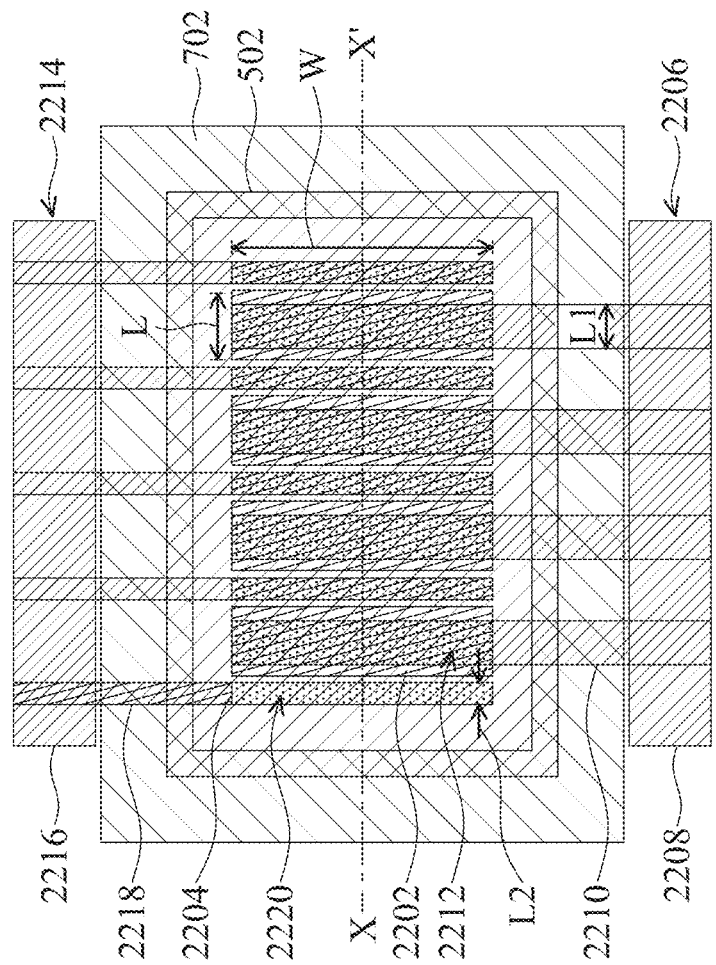
FIG. 22A illustrates a top-down (layout) view of an alternative embodiment of a Schottky barrier device portion of the semiconductor device 200, in accordance with some embodiments.
Figure 22B:
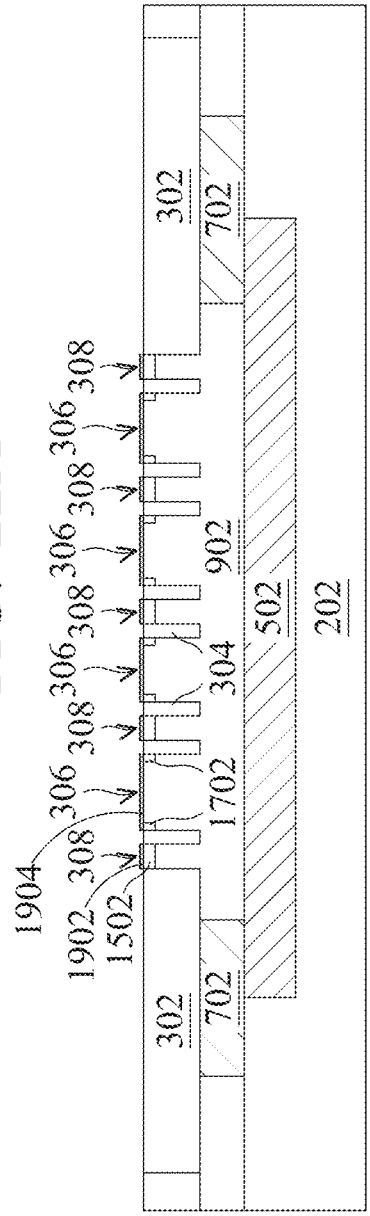
FIG. 22B illustrates a cross-section view of the Schottky barrier device of FIG. 22A, along a plane substantially parallel to the section X-X' of FIG. 22A, in accordance with some embodiments.

The example of FIG. 22A illustrates a top-down (layout) view of an alternative embodiment of a Schottky barrier device formed in the SBD region 204 of the semiconductor device 200. FIG. 22B illustrates a cross-section view of the Schottky barrier device of FIG. 22A, along a plane substantially parallel to the section X-X' of FIG. 22A. It is noted that the Schottky barrier device shown and discussed with reference to FIGS. 22A and 22B is substantially similar to the Schottky barrier device shown and discussed with reference to FIGS. 21A and 21B, except that the device of FIGS. 22A/22B includes a greater number of fingers (and associated cathode regions 306 and anode regions 308). In particular, since the number of fingers 'N' is defined herein as the number of cathode fingers, the number of fingers 'N' of the device of FIGS. 22A/22B is equal to 4. By increasing the number of fingers, the Schottky diode width 'W', and associated forward current, is increased. In some embodiments, a total number of fingers may be in a range of between 1 and 15.

The example of FIG. 22A illustrates active (OD) regions 2202, 2204, within which the cathode region 306 and the anode regions 308 are formed in the P-well region 902, and which are isolated from each other and/or from other devices by the isolation features 302, 304. In the depicted example, the cathode region 306 is formed within the active region 2202, and the anode regions 308 are formed within the active regions 2204. The DNW region 502 is also illustrated and fully encloses the active regions 2202, 2204 (as shown in the top-down view of FIG. 22A). The N-well regions 702, as shown, circumscribes (as shown in the top-down view of FIG. 22A) and partially overlaps with the DWN region 502 (as shown in the top-down view of FIG. 22A and the cross-section view of FIG. 22B). The N-well regions 702 also circumscribe the P-well region 902. As previously described, the N-well regions 702 are floating and provide part of a contiguous isolation structure (or guard ring structure), together with the isolation features 302 and the DNW region 502, to effectively isolate the Schottky barrier diode formed in the SBD region 204.

FIG. 22A further illustrates a cathode 2206 having a common electrode portion 2208 and a plurality of finger portions 2210. In some embodiments, the cathode 2206 may be formed in a first metal layer (Ml) and may comprise various conductive materials such as copper, tungsten, and/or silicide. The finger portions 2210 extend over the cathode region 306 in each of the plurality of active region 2202 and electrically connect to the metal silicide layer 1904 by way of metal contacts 2212 formed therebetween, thus providing an electrical connection to the Schottky barrier formed in the cathode region 306. As noted above, a ratio of the width 'W' to the length 'L' of the cathode of the Schottky barrier device is greater than or equal to 4, the length 'L' may be in a range of between about 0.9 microns to about 1.1 microns, and the width 'W' is in a range of between about 4 microns and 50 microns. In the present example where the number of fingers 'N' is equal to 4, and as merely one embodiment, if the length 'L' of a finger portion 2210 is equal to 1 micron and the width 'W' of a finger portion 2210 is equal to 4 microns, then the area of the cathode of the Schottky barrier device will be equal to 'L'x'W'x# of fingers=16 microns. Thus, by increasing the number of fingers and associated device area, the forward current of the device also increases.

Also shown in FIG. 22A is an anode 2214 having a common electrode portion 2216 and a plurality of finger portions 2218 that are interdigitated with the plurality of finger portions 2210 of the cathode 2206. In some embodiments, the anode 2214 may be formed in a first metal layer (Ml) and may comprise various conductive materials such as copper, tungsten, and/or silicide. The plurality of finger portions 2218 extend over the anode regions 308 in the active regions 2204 and electrically connect to the metal silicide layers 1902 by way of metal contacts 2220 formed therebetween, thus providing an electrical connection to the P+ regions 1502 of the Schottky barrier diode formed in the anode regions 308.

Thus, the various embodiments described herein offer several advantages over the existing art. It will be understood that not all advantages have been necessarily discussed herein, no particular advantage is required for all embodiments, and other embodiments may offer different advantages. For example, embodiments discussed herein include device structures and methods for fabrication of Schottky barrier diodes that address various existing challenges, as discussed above. The methods and Schottky diodes described herein, in some embodiments, are designed to have a low Schottky barrier height, which provides a low forward turn-on voltage and high forward current. Such devices, by way of example, may be used for RF energy harvesting applications such as RFID applications, wireless charging of mobile devices, voltage doubler RF-to-DC rectifiers, and other related applications. While Schottky diodes may often include a metal silicide layer in contact with an N-well region, embodiments of the present disclosure include a metal silicide layer in contact with a P-well region, which exhibits a lower Schottky barrier height (and higher forward current) than contact to an N-well region. Embodiments disclosed herein also utilize STI regions, and a floating N-well/deep N-well/N-well structure to provide a contiguous isolation structure that effectively isolates the Schottky barrier diode. The anode and cathode of the Schottky barrier diodes may also be formed as interdigitated finger structures. By increasing the number of fingers, the Schottky diode width and associated forward current may be increased. Additional embodiments and advantages will be evident to those skilled in the art in possession of this disclosure.

Thus, one of the embodiments of the present disclosure described a semiconductor device including a substrate having a P-well region, an N-well region disposed on either side of and abutting the P-well region, and a deep N-well region disposed beneath and abutting both the P-well region and at least part of the N-well region on either side of the P-well region. In some embodiments, the semiconductor device further includes a first conductive layer formed over a cathode region of the P-well region, where a Schottky barrier is formed at a junction of the first conductive layer and the P-well region. In some examples, the semiconductor device further includes a second conductive layer formed over anode regions of the P-well region, where the anode regions are disposed on either side of the cathode region.

In another of the embodiments, discussed is a semiconductor device including a substrate having an SBD region and a logic region adjacent to the SBD region. In some embodiments, the semiconductor device further includes a P-well region formed in the SBD region, where an N-well region circumscribes and abuts the P-well region, and where a deep N-well region is disposed beneath and abuts both the P-well region and at least part of the N-well region. In some examples, the semiconductor device further includes a cathode having at least one conductive finger portion that extends over a cathode region of the P-well region, where the conductive finger portion electrically connects to a Schottky barrier formed in the cathode region of the P-well region. In some embodiments, the semiconductor device further includes an anode having a first plurality of conductive finger portions that are interdigitated with the at least one conductive finger portion of the cathode, where the first plurality of conductive finger portions extends over respective ones of a plurality of anode regions of the P-well region.

In yet another of the embodiments, discussed is a method that includes forming isolation structures in an SBD region of a substrate, where the isolation structures define and isolate a cathode region from anode regions disposed on either side of the cathode region. In some embodiments, the method further includes implanting the substrate with a first N-type dopant to form a deep N-well region in the SBD region. In various examples, the method further includes implanting the substrate with a second N-type dopant to form an N-well region that circumscribes the SBD region and that at least partially overlaps the deep N-well region. In some cases, the method further includes implanting the substrate with a P-type dopant to form a P-well region that is circumscribed by the N-well region and abuts both the N-well region and the deep N-well region, where the P-well region includes the cathode region and the anode regions. In some embodiments, the method further includes forming a first metal silicide layer over the cathode region of the P-well region and a second metal silicide layer over the anode regions of the P-well region, where a Schottky barrier is formed at a junction of the first metal silicide layer and the P-well region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate including a P-well region, an N-well region disposed on either side of and abutting the P-well region, and a deep N-well region disposed beneath and abutting both the P-well region and at least part of the N-well region on either side of the P-well region;
a first conductive layer formed over a cathode region of the P-well region, wherein a Schottky barrier is formed at a junction of the first conductive layer and the P-well region; and
a second conductive layer formed over anode regions of the P-well region, wherein the anode regions are disposed on either side of the cathode region.

2. The semiconductor device of claim 1, further comprising first isolation features disposed within the P-well region, wherein the first isolation features isolate the cathode region from the anode regions.

3. The semiconductor device of claim 1, wherein the N-well region circumscribes the P-well region.

4. The semiconductor device of claim 1, wherein the N-well region disposed on either side of the P-well region and the deep N-well region are floating, and wherein the N-well region and the deep N-well region form part of a contiguous isolation structure that isolates the P-well region.

5. The semiconductor device of claim 1, wherein the first conductive layer includes nickel silicide (NiSi) or cobalt silicide (CoSi).

6. The semiconductor device of claim 1, further comprising N+ regions formed at opposing edges of the cathode region in the P-well region.

7. The semiconductor device of claim 1, further comprising P+ regions formed in the anode regions of the P-well region, wherein the second conductive layer contacts the P+ regions.

8. The semiconductor device of claim 1, wherein the second conductive layer includes a metal silicide layer.

9. The semiconductor device of claim 1, wherein the cathode region and the anode regions are formed as interdigitated finger structures.

10. The semiconductor device of claim 2, further comprising second isolation features disposed over the N-well region and on opposing sides of the P-well region, wherein the second isolation features isolate the semiconductor device from an adjacent device.

11. A semiconductor device, comprising:
a substrate including a Schottky barrier diode (SBD) region and a logic region adjacent to the SBD region;
a P-well region formed in the SBD region, wherein an N-well region circumscribes and abuts the P-well region, and wherein a deep N-well region is disposed beneath and abuts both the P-well region and at least part of the N-well region;
a cathode including at least one conductive finger portion that extends over a cathode region of the P-well region, wherein the conductive finger portion electrically connects to a Schottky barrier formed in the cathode region of the P-well region; and
an anode including a first plurality of conductive finger portions that are interdigitated with the at least one conductive finger portion of the cathode, wherein the first plurality of conductive finger portions extends over respective ones of a plurality of anode regions of the P-well region.

12. The semiconductor device of claim 11, further comprising a first metal silicide layer in contact with the cathode region of the P-well region, wherein the Schottky barrier is formed at a junction of the first metal silicide layer and the P-well region, and wherein the conductive finger portion is formed over and electrically connects to the first metal silicide layer.

13. The semiconductor device of claim 12, further comprising a second metal silicide layer in contact with the anode regions of the P-well region, wherein the first plurality of conductive finger portions is formed over and electrically connects to respective ones of the second metal silicide layer.

14. The semiconductor device of claim 11, further comprising shallow trench isolation (STI) features formed within the P-well region, wherein the STI features isolate the cathode region from the anode regions.

15. The semiconductor device of claim 11, wherein the N-well region and the deep N-well region are floating, and wherein the N-well region and the deep N-well region form part of a contiguous isolation structure that isolates the SBD region.

16. The semiconductor device of claim 13, wherein first metal silicide layer and the second metal silicide layer include nickel silicide (NiSi) or cobalt silicide (CoSi).

17. The semiconductor device of claim 11, wherein the cathode further comprises a second plurality of conductive finger portions that are interdigitated with the first plurality of conductive finger portions, and wherein the second plurality of conductive finger portions extend over respective ones of a plurality of cathode regions of the P-well region.

18. The semiconductor device of claim 11, wherein a ratio of a width 'W' of the cathode to a length 'L' of the cathode is greater than or equal to 4.

19. A semiconductor device, comprising:
a plurality of isolation structures in a Schottky barrier diode (SBD) region of a substrate, wherein the isolation structures define and isolate a cathode region from anode regions disposed on either side of the cathode region;
a deep N-well region disposed within the SBD region, the deep N-well region including a first N-type dopant implanted into the substrate;
an N-well region that circumscribes the SBD region and that at least partially overlaps the deep N-well region, the N-well region including a second N-type dopant implanted into the substrate;
a P-well region that is circumscribed by the N-well region and abuts both the N-well region and the deep N-well region, the P-well region including a P-type dopant implanted into the substrate, wherein the P-well region includes the cathode region and the anode regions; and
a first metal silicide layer disposed over the cathode region of the P-well region and a second metal silicide layer disposed over the anode regions of the P-well region, wherein a Schottky barrier is formed at a junction of the first metal silicide layer and the P-well region.

20. The semiconductor device of claim 19, wherein the N-well region and the deep N-well region are floating, and wherein the N-well region and the deep N-well region form part of a contiguous isolation structure that isolates the P-well region.

* * * * *